United States Patent
Branch et al.

(10) Patent No.: US 7,236,036 B2
(45) Date of Patent: Jun. 26, 2007

(54) APPARATUS AND METHOD FOR GENERATING PULSES

(75) Inventors: Charles M. Branch, Dallas, TX (US); Steven C. Bartling, Plano, TX (US)

(73) Assignee: Texas Instruments Incorported, Dallas, TX (US)

( * ) Notice: Subject to any disclaimer, the term of this patent is extended or adjusted under 35 U.S.C. 154(b) by 122 days.

(21) Appl. No.: 11/104,030

(22) Filed: Apr. 12, 2005

(65) Prior Publication Data

US 2006/0226885 A1    Oct. 12, 2006

(51) Int. Cl.
*H03K 3/13* (2006.01)
(52) U.S. Cl. .................. 327/291; 327/298; 327/299
(58) Field of Classification Search ............... None
See application file for complete search history.

(56) References Cited

U.S. PATENT DOCUMENTS 5,539,337 A * 7/1996 Taylor et al. .................. 326/94
5,900,754 A * 5/1999 Nakatani .................... 327/158
6,107,847 A * 8/2000 Johnson et al. ............. 327/143
6,239,627 B1 * 5/2001 Brown et al. ............... 327/116

OTHER PUBLICATIONS

Ma, Albert and Asanovic, Krste; "A Double-Pulsed Set-Conditional-Reset Flip-Flop"; MIT Laboratory for Computer Science; http://www.Ics.mit.edu/publications/pubs/ps/MIT-LCS-TR-844.ps.

* cited by examiner

*Primary Examiner*—Timothy P. Callahan
*Assistant Examiner*—An T. Luu
(74) *Attorney, Agent, or Firm*—Wade J. Brady, III; Frederick J. Telecky, Jr.

(57) ABSTRACT

An apparatus for generating pulses includes: (a) A delay unit having an input delay locus for receiving a delay unit input signal and an output delay locus for presenting an output delay signal. The delay unit output signal is delayed by a delay interval with respect to the input delay signal. (B) A latch coupled with the delay unit to selectively keep the delay unit input signal at at least one predetermined signal level.

17 Claims, 4 Drawing Sheets

APPARATUS AND METHOD FOR GENERATING PULSES

BACKGROUND OF THE INVENTION

The present invention is directed to pulse generating apparatuses. Pulse generation is an important function for many electrical devices and products. Pulses are used for many purposes including, by way of example and not by way of limitation, driving pulse width modulation circuitry. Pulses provided must be of predictable and consistent duration and period to provide a reliable timing circuit or modulating circuit or other feature of a product using the pulses.

Some prior art pulse generating apparatuses used long chains of series-connected delay units, known as delay chains, to establish desired delay intervals for generating pulses. However, in today's products there is a trend toward requiring smaller more compact circuitry and minimizing die space or "real estate" required by a circuit or apparatus is a design objective of increasing importance. One response has been to use a feed forward circuit arrangement by which a delay chain is used twice. By such an arrangement a single delay chain is established on a die and is used twice so that greater delays may be realized in a circuit using less die space than was required by earlier circuits not employing a feed forward technique.

A problem with such prior art devices has been floating nodes (see FIG. 1). Reliance on capacitance alone at a node to maintain circuit values such as a predetermined voltage is not reliable because without actively maintaining the desired value at the node, the charge will bleed off. Today's circuitry operates at sufficiently fast speeds that there is insufficient capacity at circuit nodes to maintain the desired logic values (e.g., voltage values) without driving the node. The circuit nodes cannot reliably maintain the required circuit values and, as a consequence, the circuit performance is also unreliable. This unreliability may be manifested, for example, in spurious pulses or truncated pulses from unpredictable coupling with a node. Said another way, unpredictable coupling with a node or unpredictable charging or discharging of a node in a circuit may cause the circuit to generate pulses having unpredictable shape or duration or other unpredictable characteristics.

There is a need for an apparatus and method for generating pulses that is compact and involves no floating nodes.

SUMMARY OF THE INVENTION

An apparatus for generating pulses includes: (a) A delay unit having an input delay locus for receiving a delay unit input signal and an output delay locus for presenting an output delay signal. The delay unit output signal is delayed by a delay interval with respect to the input delay signal. (B) A latch coupled with the delay unit to selectively keep the delay unit input signal at at least one predetermined signal level.

It is, therefore, an object of the present invention to provide an apparatus and method for generating pulses that is compact and involves no floating nodes.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
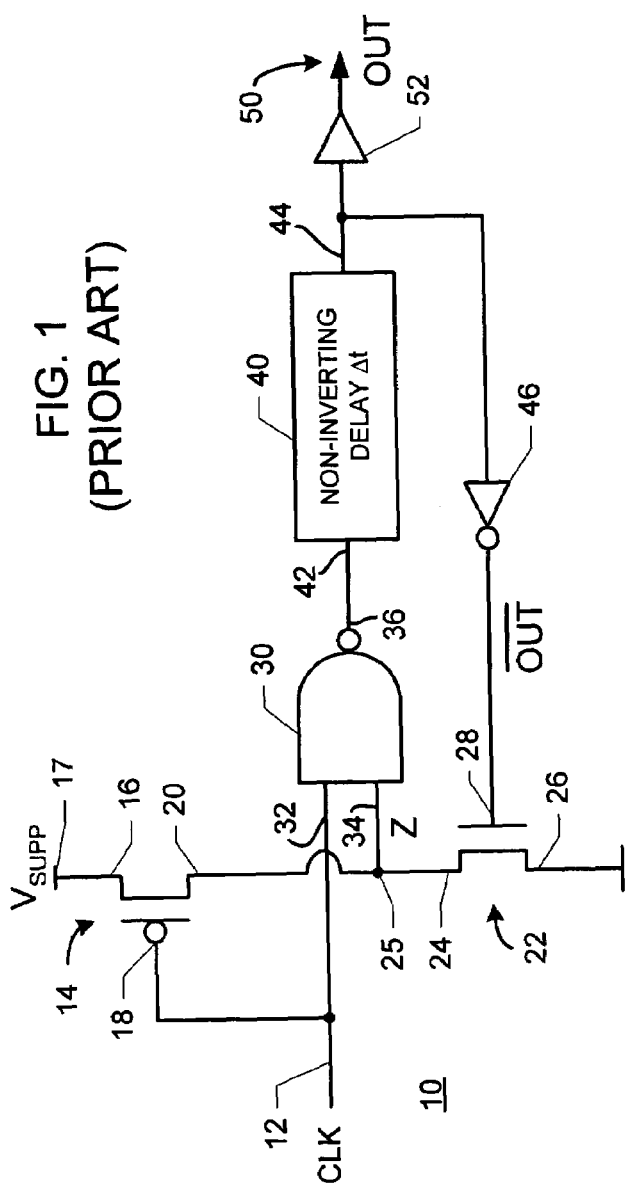
FIG. 1 is a schematic diagram of a representative prior art pulse generating apparatus.

FIG. 1 is a schematic diagram of a representative prior art pulse generating apparatus. In FIG. 1, a pulse generating apparatus 10 receives a clock signal CLK at an input locus 12. Input locus 12 is coupled with a PMOS transistor 14. PMOS transistor 14 has a source 16 coupled with a supply voltage locus 17, a gate 18 coupled with input locus 12 and a drain 20 coupled with an NMOS transistor 22. NMOS transistor 22 has a source 24 coupled with drain 20 of PMOS transistor 14, a drain 26 coupled with ground 29 and a gate 28.

A logic gate 30 has a first logic input locus 32 coupled with input locus 12 and a second logic input locus 34 coupled at a node 25 with drain 20 of PMOS transistor 14 and source 24 of NMOS transistor 22. Clock signal CLK is therefore present at first logic input locus 32. Second logic input locus 34 is indicated as carrying a signal Z for purposes of describing operation of apparatus 10. Logic gate 30 has a logic output locus 36 connected with a delay unit 40 at a delay unit input locus 42. Delay unit 40 has a delay output locus 44 at which delay unit 40 presents delay output signals. Delay output signals appearing at delay output locus 44 are delayed by an interval Δt with respect to signals received at delay input locus 42.

Gate 28 of NMOS transistor 22 is coupled with delay output locus 44 via an inverter 46. An apparatus output locus 50 is coupled with delay output locus 44 via a buffer 52.

Figure 2:
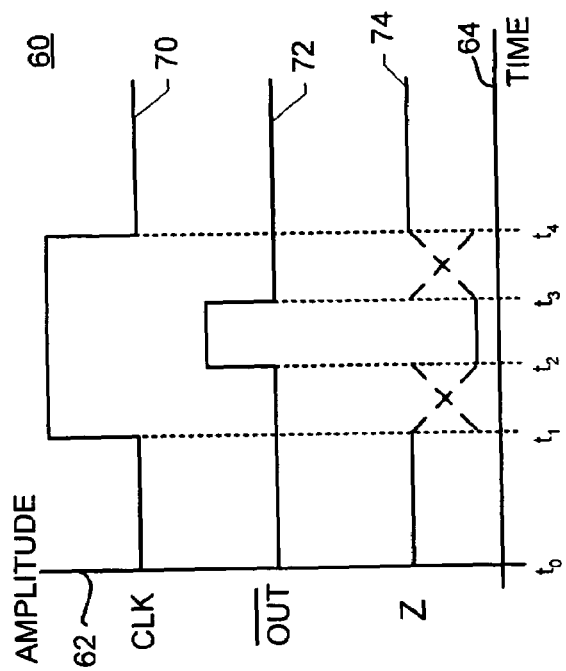
FIG. 2 is a graphical representation of selected signals associated with the operation of the prior art apparatus illustrated in FIG. 1.

FIG. 2 is a graphical representation of selected signals associated with the operation of the prior art apparatus illustrated in FIG. 1. In FIG. 2, signals are represented on a grid 60 with respect to a vertical axis 62 representing signal amplitude and with respect to a horizontal axis 64 representing time. A clock signal CLK is represented by a signal trace 70. An inversion $\overline{OUT}$ of output signal OUT is represented by a signal trace 72. A signal Z is represented by a signal trace 74.

Clock signal CLK appears at input locus 12 (FIG. 1). Signal $\overline{OUT}$ is presented to gate 28 of NMOS transistor 22 by inverter 46 (FIG. 1). Signal Z appears at second logic input locus 34 (FIG. 1).

Considering FIGS. 1 and 2 together, during the interval $t_0$-$t_1$, apparatus 10 is in a stable state. Clock signal CLK is at a low value, thereby causing PMOS transistor 14 to conduct. A supply voltage $V_{SUPP}$ is thereby applied to node 25 and to source 24 of NMOS transistor 22. Signal Z is high in response to presence of supply voltage $V_{SUPP}$. Because clock signal CLK is low and signal Z is high, logic gate 30 (configured as a NAND gate for purposes of this description) presents a high signal at logic output locus 36. Delay unit 40 is a non-inverting delay unit, so signals appearing at delay output locus 44 are high. High signals at delay output locus 44 are applied to inverter 46 and thence are presented as low signals $\overline{OUT}$ to gate 28 of NMOS transistor 22. NMOS transistor 22 remains in a non-conducting state when gate 28 is low.

At time $t_1$, clock signal CLK changes state to a high value. PMOS transistor 14 is rendered non-conductive because a high clock signal CLK is applied to gate 18. At time $t_1$, logic gate 36 receives a high clock signal CLK at first logic input locus 32 and receives a high signal Z at logic input locus 34. Logic gate 30 (configured as a NAND gate) therefore presents a low signal at logic output locus 36.

At time $t_2$, a delay $\Delta t$ after time $t_1$, the delay output signal OUT at delay output locus 44 goes low, inverter 46 presents a high signal $\overline{OUT}$ to gate 28 of NMOS transistor 22 and NMOS transistor 22 conducts. When NMOS transistor 22 conducts, signal Z is drawn to ground because of its connection between node 25 and ground 29 through NMOS transistor 22.

During the interval $t_1$-$t_2$, supply voltage $V_{SUPP}$ is no longer applied to node 25, nor is node 25 coupled with ground 29. Node 25 is thus floating during the interval $t_1$-$t_2$ with no applied voltage potential to hold node 25 at any particular value.

At time $t_2$, clock signal CLK is high and signal Z is low. Logic gate 30 therefore presents a high signal at logic output locus 36. At time $t_3$, a delay $\Delta t$ after time $t_2$, the delay output signal OUT at delay output locus 44 goes high, inverter 46 presents a low signal $\overline{OUT}$ to gate 28 of NMOS transistor 22 and NMOS transistor 22 ceases conducting.

At time $t_4$, clock signal CLK goes low so that logic gate 30 presents a high signal at logic output locus 36. Applying a low clock signal CLK to gate 18 of PMOS transistor 14 causes PMOS transistor 14 to conduct so that supply voltage $V_{SUPP}$ is applied to node 25 and signal Z goes high.

During the interval $t_3$-$t_4$ NMOS transistor 22 does not conduct so node 25 is no longer connected with ground 29 through NMOS transistor 22. Clock signal CLK is still high so PMOS transistor 14 is not conductive so that supply voltage $V_{SUPP}$ is not applied to node 25. Node 25 is thus floating during the interval $t_3$-$t_4$ with no applied voltage potential to hold node 25 at any particular value.

Floating nodes such as node 25 (FIG. 1) during time intervals $t_1$-$t_2$, $t_3$-$t_4$ introduce inaccuracy and unpredictability into performance by apparatus 10. This unreliability may be manifested, for example, in spurious pulses or truncated pulses caused by unpredictable coupling by node 25. Said another way, unpredictable coupling by node 25 or unpredictable charging or discharging of node 25 in apparatus 10 may cause the apparatus 10 to generate pulses (i.e., delay output signal OUT) having unpredictable shape or duration or other unpredictable characteristics.

Figure 3:
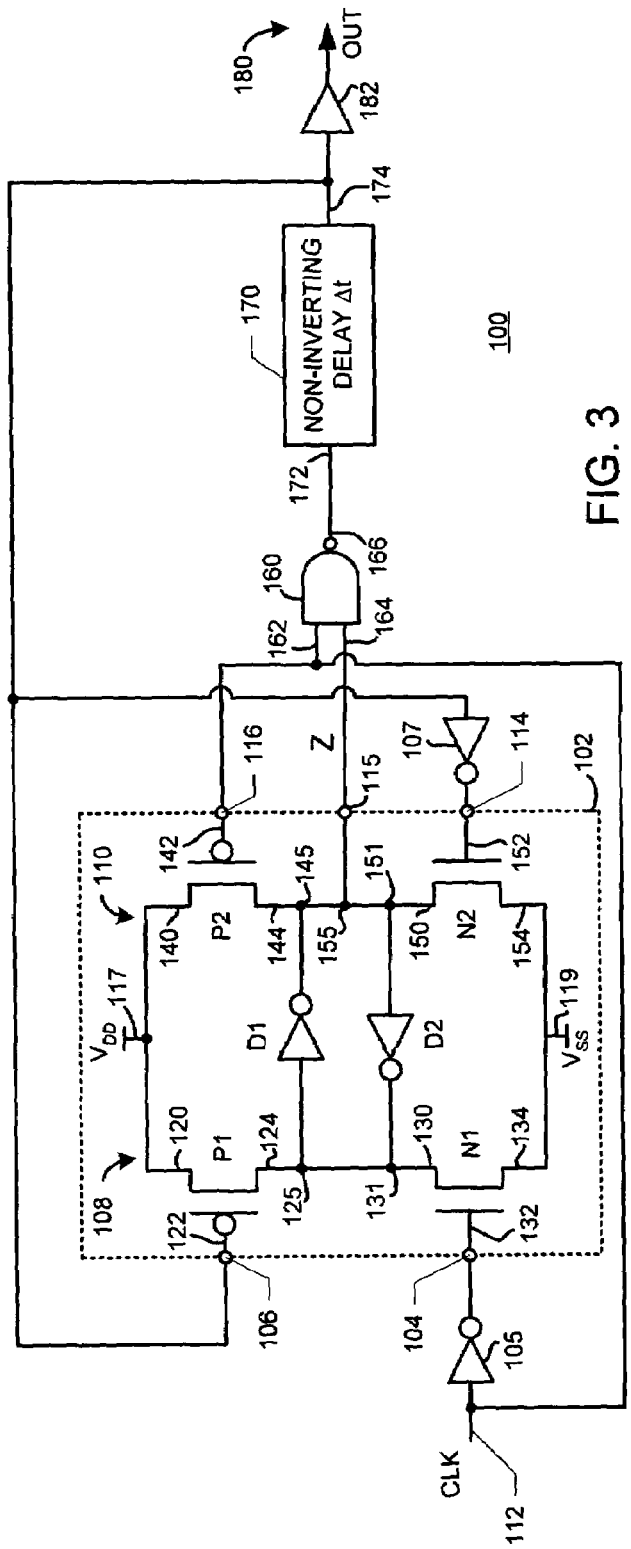
FIG. 3 is a schematic diagram of the preferred embodiment of a pulse generating apparatus according to the present invention.

FIG. 3 is a schematic diagram of the preferred embodiment of a pulse generating apparatus according to the present invention. In FIG. 3, a pulse generating apparatus 100 receives a clock signal CLK at an input locus 112. Input locus 112 is coupled via an inverter 105 with a latch device 102 at a latch input locus 104 and coupled with a latch input locus 116. Latch device 102 is configured as a differential latch establishing parallel networks 108, 110 between an upper supply voltage locus 117 and a lower supply voltage locus 119. An upper supply voltage $V_{DD}$ is applied at upper supply voltage locus 117. A lower supply voltage $V_{SS}$ is applied at lower supply voltage locus 119.

Network 108 includes a PMOS transistor P1 and an NMOS transistor N1. PMOS transistor P1 has a source 120 coupled with upper supply voltage locus 117, a gate 122 coupled with a latch input locus 106 and a drain 124. NMOS transistor N1 has a source 130 coupled with drain 124 of PMOS transistor P1, a gate 132 coupled with latch input locus 104 and a drain 134 coupled with lower supply voltage locus 119. Network 110 includes a PMOS transistor P2 and an NMOS transistor N2. PMOS transistor P2 has a source 140 coupled with upper supply voltage locus 117, a gate 142 coupled with latch input locus 116 and a drain 144. NMOS transistor N2 has a source 150 coupled with drain 144 of PMOS transistor P2, a gate 152 coupled with a latch input locus 114 and a drain 154 coupled with lower supply voltage locus 119.

An inverter device D1 is coupled between nodes 125, 145 oriented to permit current to flow from node 125 toward node 145. Node 125 is situated between drain 124 and source 130. Node 145 is situated between drain 144 and source 150. An inverter device D2 is coupled between nodes 131, 151 oriented to permit current to flow from node 151 toward node 131. Node 131 is situated between node 125 and source 130. Node 151 is situated between node 145 and source 150. A latch output locus 115 is coupled with an output node 155. Output node 155 is situated between nodes 114, 151. Inverter devices D1, D2 cooperate to latch the potential level at node 155 when no countermanding signal or other potential is applied to node 155.

A logic gate 160 has a first logic input locus 162 coupled with latch input locus 116 and a second logic input locus 164 coupled with latch output node 155. Clock signal CLK is therefore present at first logic input locus 162. Second logic input locus 164 is indicated as carrying a signal Z for purposes of describing operation of apparatus 100. Logic gate 160 has a logic output locus 166 connected with a delay unit 170 at a delay unit input locus 172. Delay unit 170 has a delay output locus 174 at which delay unit 170 presents delay output signals. Delay output signals appearing at delay output locus 174 are delayed by an interval $\Delta t$ with respect to signals received at delay input locus 172.

Delay output locus 174 is connected with latch input locus 106 and is connected, via an inverter 107, with latch input locus 114. An apparatus output locus 180 is coupled with delay output locus 174 via a buffer 182.

Figure 4:
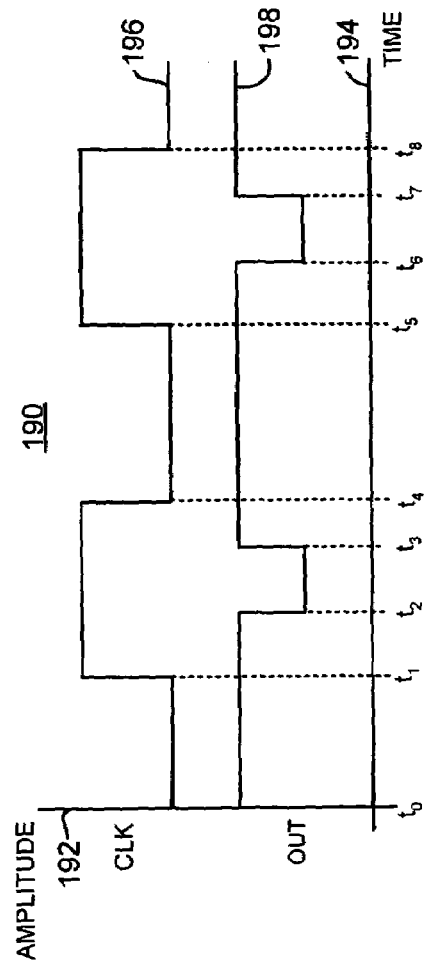
FIG. 4 is a graphical representation of selected signals associated with the operation of the apparatus illustrated in FIG. 3.

FIG. 4 is a graphical representation of selected signals associated with the operation of the apparatus illustrated in FIG. 3. In FIG. 4, signals are represented on a grid 190 with respect to a vertical axis 192 representing signal amplitude and with respect to a horizontal axis 194 representing time. A clock signal CLK is represented by a signal trace 196. An output signal OUT is represented by a signal trace 198. Clock signal CLK appears at input locus 112 (FIG. 3). Output signal OUT is presented at delay output locus 174 (FIG. 3).

Considering FIGS. 3 and 4 together, during the interval $t_0$-$t_1$, clock signal CLK is at a low value. A low value for clock signal CLK is inverted by inverter 105 to present a high signal at gate 132 of transistor N1 via latch input locus 104, thereby causing transistor N1 to conduct. Low clock signal CLK is also applied at gate 142 of transistor P2 via latch input locus 116 and causes transistor P2 to conduct. Low clock signal CLK is also applied at first logic input locus 162. When transistors P2, N1 conduct, upper supply voltage $V_{DD}$ is applied to node 155 so input signal Z to second logic input locus 162 is high. When logic gate 160 receives a low signal (i.e., low clock signal CLK) at first logic input locus 162 and receives a high signal (i.e., Z at $V_{DD}$) at second logic input 164, then a logic output signal at logic output locus 166 is high.

Also during interval $t_0$-$t_1$, output signal OUT is at a high value. A high value for output signal OUT is inverted by inverter 107 to present a high signal at gate 152 of transistor N2 via latch input locus 114, thereby causing transistor N2 to not conduct. High output signal OUT is also applied to gate 122 of transistor P1 via latch input locus 106 thereby causing transistor P1 to not conduct.

At time $t_1$, clock signal CLK changes state to a high value. A high value for clock signal CLK is inverted by inverter 105 to present a low signal at gate 132 of transistor N1 via latch input locus 104, thereby causing transistor N1 to not conduct. High clock signal CLK is also applied at gate 142 of transistor P2 via latch input locus 116 and causes transistor P2 to not conduct. High clock signal CLK is also applied at first logic input locus 162. Output signal OUT is still high so transistors P1, N2 continue to be non-conducting.

Inverter devices D1, D2 cooperate to latch the potential level at node 155 to $V_{DD}$ so input signal Z to second logic input locus 162 remains high. When logic gate 160 receives a high signal (i.e., high clock signal CLK) at first logic input locus 162 and receives a high signal (i.e., Z at $V_{DD}$) at second logic locus 164, then a logic output signal at logic output locus 166 is low.

At time $t_2$, a delay $\Delta t$ after time $t_1$, the delay output signal OUT at delay output locus 174 goes low. Inverter 107 presents a high signal OUT to gate 152 of transistor N2 via latch input locus 114 thereby causing transistor N2 to conduct. Low output signal OUT is also applied to gate 122 of transistor P1 via latch input locus 106 thereby causing transistor P1 to conduct. When transistors P1, N2 conduct, lower supply voltage $V_{SS}$ is applied to node 155 so input signal Z to second logic input locus 162 is low. When logic gate 160 receives a high signal (i.e., high clock signal CLK) at first logic input locus 162 and receives a low signal (i.e., Z at $V_{SS}$) at second logic input locus 164, then a logic output signal at logic output locus 166 is high.

At time $t_3$, a delay $\Delta t$ after time $t_2$, output signal OUT goes high. As explained earlier herein, a high value for output signal OUT is inverted by inverter 107 to present a high signal at gate 152 of transistor N2 via latch input locus 114, thereby causing transistor N2 to not conduct. High output signal OUT is also applied to gate 122 of transistor P1 via latch input locus 106 thereby causing transistor P1 to not conduct. Inverter devices D1, D2 cooperate to latch the potential level at node 155 to $V_{SS}$ so input signal Z to second logic input locus 162 is low. When logic gate 160 receives a high signal (i.e., high clock signal CLK) at first logic input locus 162 and receives a low signal (i.e., Z at $V_{SS}$) at second logic input locus 164, then a logic output signal at logic output locus 166 is high.

At time $t_4$ clock signal CLK goes low. A low value for clock signal CLK is inverted by inverter 105 to present a high signal at gate 132 of transistor N1 via latch input locus 104, thereby causing transistor N1 to conduct. Low clock signal CLK is also applied at gate 142 of transistor P2 via latch input locus 116 and causes transistor P2 to conduct. Low clock signal CLK is also applied at first logic input locus 162. When transistors P2, N1 conduct, upper supply voltage $V_{DD}$ is applied to node 155 so input signal Z to second logic input locus 162 is high. When logic gate 160 receives a low signal (i.e., low clock signal CLK) at first logic input locus 162 and receives a high signal (i.e., Z at $V_{DD}$) at second logic input locus 164, then a logic output signal at logic output locus 166 is high.

Clock signal CLK remains low and output signal OUT remains high until clock signal CLK goes high again at time $t_5$. Events following time $t_5$ are substantially the same as described earlier in connection with time interval $t_1$-$t_4$ and in the interest of avoiding prolixity will not be repeated here.

It is important that signals provided at input loci 106, 114 are inverted with respect to signals applied at input loci 104, 116. Inversions may be effected at various loci within pulse generating apparatus 100 to establish the desired relationship between signals at loci 106, 114 and signals at loci 104, 116. By way of example and not by way of limitation, signal inversions may be effected within logic gate 160, within delay unit 170 and using inverter devices placed between components, such as inverter 107, an inverter device (not shown) coupled between delay device 170 and input locus 106 or an inverter device (not shown) coupled between logic gate 160 and delay unit 170. The number and location of inversions is not limited so long as signals provided at input loci 106, 114 are inverted with respect to signals applied at input loci 104, 116.

Figure 5:
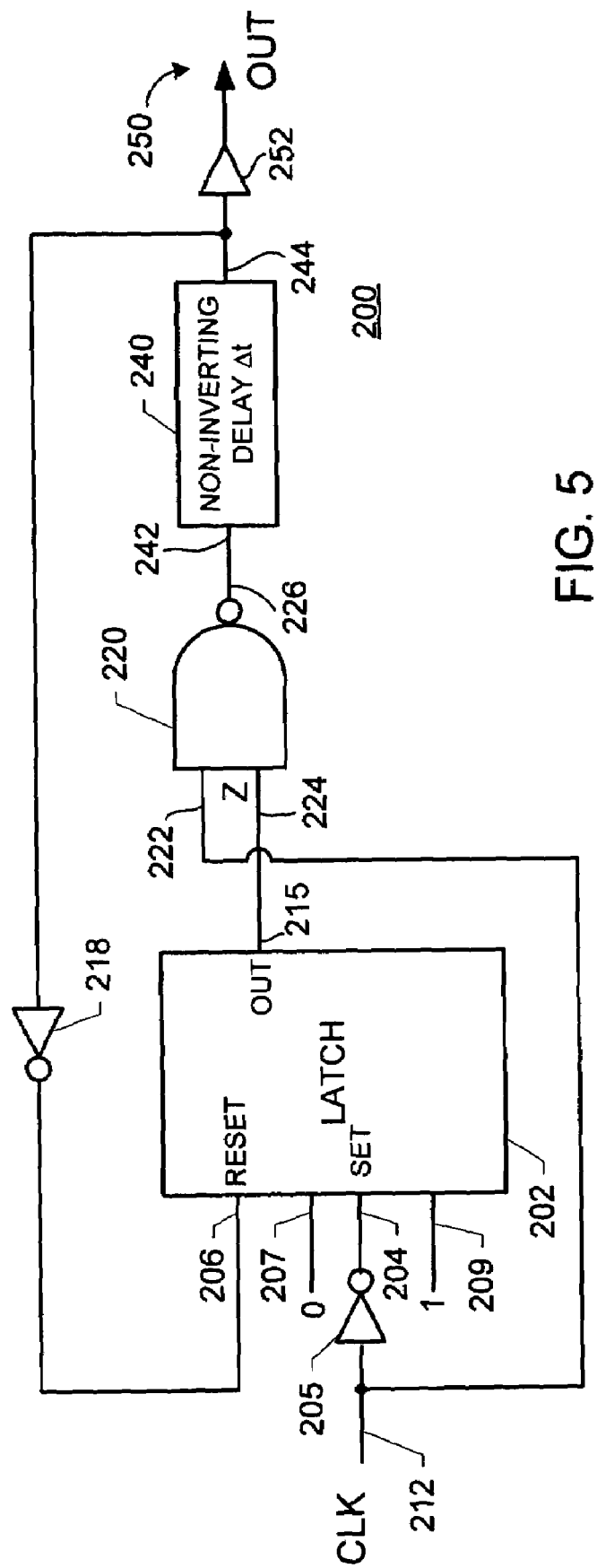
FIG. 5 is a schematic diagram of a second embodiment of a pulse generating apparatus according to the present invention.

FIG. 5 is a schematic diagram of a second embodiment of a pulse generating apparatus according to the present invention. In FIG. 5, a pulse generating apparatus 200 receives a clock signal CLK at an input locus 212. Input locus 212 is coupled with a latch device 202 at a latch input locus 204 via an inverter 205. Preferably latch input locus 204 is a SET locus for latch device 202. Latch device 202 is preferably configured so that a high signal at SET input locus 204 effects coupling to apply a signal presented at a data input locus 209 with a latch output locus 215 and maintaining or latching that signal value from data input locus 209 until a countermanding signal is applied to latch output locus 215. Latch 202 also has a RESET locus 206. Latch device 202 is preferably configured so that a high signal at RESET input locus 206 effects coupling to apply a signal presented at a data input locus 207 with a latch output locus 215 and maintaining or latching that signal value from data input locus 207 until a countermanding signal is applied to latch output locus 215. In the exemplary embodiment illustrated in FIG. 5, the signal presented at data input locus 209 is a high signal represented by a "1" and data input locus 207 is a low signal represented by a "0".

A logic gate 220 has a first logic input locus 222 coupled with input locus 212 and a second logic input locus 224 coupled with latch output node 215. Clock signal CLK is therefore present at first logic input locus 222. Second logic input locus 224 is indicated as carrying a signal Z for purposes of describing operation of apparatus 200. Logic gate 220 has a logic output locus 226 connected with a delay unit 240 at a delay unit input locus 242. Delay unit 240 has a delay output locus 244 at which delay unit 240 presents delay output signals. Delay output signals appearing at delay output locus 244 are delayed by an interval $\Delta t$ with respect to signals received at delay input locus 242.

Delay output locus 244 is connected with latch input locus 206 via an inverter 218. An apparatus output locus 250 is coupled with delay output locus 244 via a buffer 252.

Considering FIGS. 4 and 5 together, during the interval $t_0$-$t_1$, clock signal CLK is at a low value. A low value for clock signal CLK is inverted by inverter 205 to present a high signal at latch input locus 204. As earlier described herein, latch 202 is configured so that a high signal at SET locus (i.e., latch input locus 204) effects coupling of a value presented at data input locus 209 with latch output locus 215. Thus, during the interval $t_0$-$t_1$ a high (i.e., "1" value) is applied to latch output locus 215. Low clock signal CLK is also applied at logic input locus 222. A low value presented at first logic input locus 222 will in any event yield a high output at logic output locus 226.

Also during interval $t_0$-$t_1$, output signal OUT is at a high value. A high value for output signal OUT is inverted by inverter 218 to present a low value at latch input locus 206 (i.e., the RESET locus) so that no latching of data appearing at data input locus 207 occurs.

At time $t_1$, clock signal CLK changes state to a high value. Latch 202 will continue to latch a "1" value to latch output locus 215 until a countermanding signal is applied to latch output locus 215. Thus, first logic input locus is at a high value and second logic input locus 124 is at a high value. When logic gate 220 receives a high signal (i.e., high clock signal CLK) at first logic input locus 222 and receives a high signal (i.e., Z at "1") at second logic input locus 224, then a logic output signal at logic output locus 226 is low.

At time $t_2$, a delay $\Delta t$ after time $t_1$, the delay output signal OUT at delay output locus 274 goes low. Inverter 218 presents a high signal to latch input locus 206 so that a low value (i.e., a "0") is applied and latched to latch output locus 215. When logic gate 220 receives a high signal (i.e., high clock signal CLK) at first logic input locus 222 and receives a low signal (i.e., Z at "0") at second logic input locus 224, then a logic output signal at logic output locus 226 is high.

At time $t_3$, a delay $\Delta t$ after time $t_2$, output signal OUT goes high. A high value for output signal OUT is inverted by inverter 218 to present a high signal at latch input locus 206. Latch 202 will continue to latch a "0" value to latch output locus 215 until a countermanding signal is applied to latch output locus 215. Thus, first logic input locus 222 is at a high value and second logic input locus 224 is at a high value. When logic gate 220 receives a high signal (i.e., high clock signal CLK) at first logic input locus 222 and receives a low signal (i.e., Z at "0") at second logic input locus 224, then a logic output signal at logic output locus 226 is high.

At time $t_4$ clock signal CLK goes low. A low value for clock signal CLK is inverted by inverter 205 to present a high signal at latch input locus 204, thereby latching a "1" or high value to latch output locus 215. When logic gate 220 receives a low signal (i.e., low clock signal CLK) at first logic input locus 222 and receives a high signal (i.e., Z at "1") at second logic locus 224, then a logic output signal at logic output locus 226 is high.

Clock signal CLK remains low and output signal OUT remains high until clock signal CLK goes high again at time $t_5$. Events following time $t_5$ are substantially the same as described earlier in connection with time interval $t_1$-$t_4$ and in the interest of avoiding prolixity will not be repeated here.

It is important that signals provided at input locus 206 are inverted with respect to signals applied at input locus 204. Inversions may be effected at various loci within pulse generating apparatus 200 to establish the desired relationship between signals at loci 206, 204. By way of example and not by way of limitation, signal inversions may be effected within logic gate 220, within delay unit 240 and using inverter devices placed between components, such as inverter 218 and an inverter device (not shown) coupled between logic gate 220 and delay unit 240. The number and location of inversions is not limited so long as signals provided at input loci 206, 2o44 are inverted with respect to each other.

Figure 6:
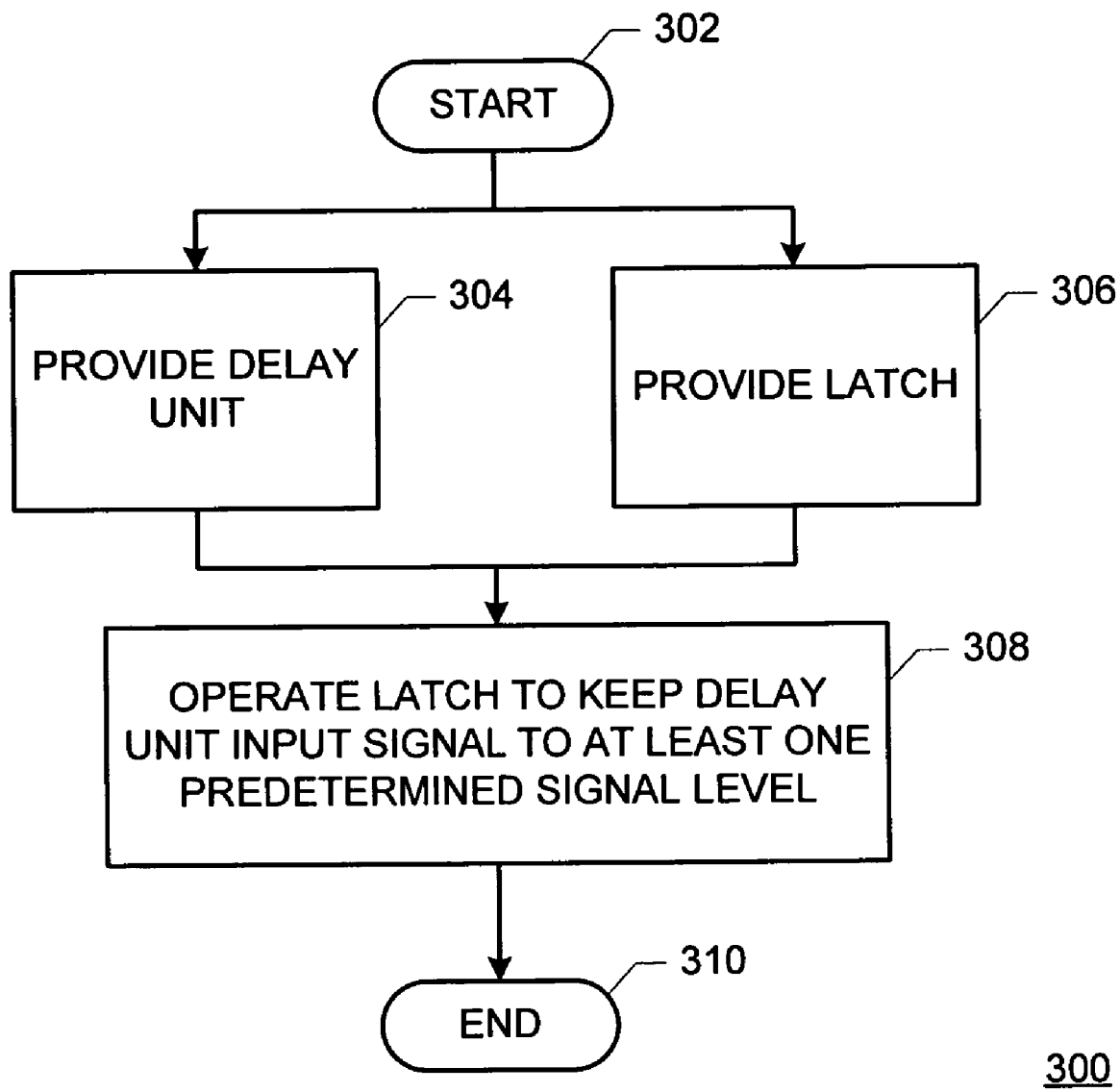
FIG. 6 is a flow chart illustrating the method of the present invention.

FIG. 6 is a flow chart illustrating the method of the present invention. In FIG. 6, a method 300 for generating pulses begins at a START locus 302. Method 300 continues with the step of, in no particular order: (1) Providing a delay unit, as indicated by a block 304. The delay unit has an input delay locus for receiving a delay unit input signal and an output delay locus for presenting an output delay signal. The delay unit output signal is delayed by a delay interval with respect to the input delay signal. (2) providing a latch coupled with the delay unit, as indicated by a block 306.

Method 300 continues with the step of operating the latch to keep the delay unit input signal to at least one predetermined signal level, as indicated by a block 308. Method 300 terminates at an END locus 310.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. A pulse generating apparatus; the apparatus receiving a clock signal at an input locus and presenting a pulsed output signal at an output locus; the apparatus comprising:
   (a) a latch device having a set port, a reset port and an output port; one of said set port and said reset port being coupled with said input locus;
   (b) a logic gate having a first logic input locus, a second logic input locus and a logic output locus; said first logic input locus being coupled with said input locus; said second logic input locus being coupled with said output port; said logic gate effecting a logical comparison of signals applied to said first logic input locus and said second logic input locus and presenting a logical result signal at said logic output locus representing said logical comparison; and
   (c) a delay device having a delay input locus and a delay output locus; said delay input locus being coupled with said logic output locus; said delay device receiving delay input signals at said delay input locus and presenting delayed output signals at said delay output locus; said delayed output signals being delayed by a predetermined delay interval with respect to said delay input signals; said delay output locus being coupled with said output locus and coupled with said latch device at a feedback port; said feedback port being a selected one of said set port and said reset port that is not coupled with said input locus;
   said logic gate and said delay device cooperating to ensure that signals provided to said feedback port are inverted with respect to signals presented at said first logic input locus.

2. A pulse generating apparatus as recited in claim 1 wherein said logic gate is one of an AND gate and a NAND gate.

3. A pulse generating apparatus as recited in claim 1 wherein said latch device is a differential latch.

4. A pulse generating apparatus as recited in claim 1 wherein the apparatus is sensitive to a signal changing edge when said clock signal changes signal level from a first clock signal level to a second clock signal level, and wherein said clock signal has a signal interval at said second clock signal level following a signal changing edge; said signal interval being greater than twice said delay interval.

5. A pulse generating apparatus as recited in claim 2 wherein said latch device is a differential latch.

6. A pulse generating apparatus as recited in claim 2 wherein the apparatus is sensitive to a signal changing edge when said clock signal changes signal level from a first clock signal level to a second clock signal level, and wherein said clock signal has a signal interval at said second clock signal level following a signal changing edge; said signal interval being greater than twice said delay interval.

7. A pulse generating apparatus as recited in claim 3 wherein the apparatus is sensitive to a signal changing edge when said clock signal changes signal level from a first clock signal level to a second clock signal level, and wherein said clock signal has a signal interval at said second clock signal level following a signal changing edge; said signal interval being greater than twice said delay interval.

8. An apparatus for generating pulses; the apparatus comprising:
   (a) a delay unit; said delay unit having an input delay loci for receiving a delay unit input signal and an output delay locus for presenting an output delay signal; said delay unit output signal being delayed by a delay interval with respect to said input delay signal; and
   (b) a latch coupled with said delay unit to selectively keep said delay unit input signal at at least one predetermined signal levels;
   (c) wherein said delay unit comprises a logic gate and a delay device, and wherein said latch provides a latch output signal to said logic gate; said logic gate controlling change of said input delay signal from a first state to a second state according to a logical relationship between said first state and said latch output signal.

9. An apparatus for generating pulses as recited in claim 8 wherein said latch unit has a set port, a reset port and an output port and wherein said input delay loci has a first delay connection locus and a second delay connection locus; said output port being coupled with said first delay connection locus; one of said set port and said reset port being coupled with said second delay connection locus; said output delay locus being coupled with a feedback port; said feedback port being a selected one of said set port and said reset port that is not coupled with said second delay connection locus.

10. An apparatus for generating pulses as recited in claim 9 wherein said first delay connection locus and said second delay connection locus are input loci for said logic gate; said logic gate controlling change of said input delay signal from a first state to a second state according to a logical relationship between said input delay signal and said latch output signal.

11. An apparatus for generating pulses as recited in claim 10 wherein said logic gate and said delay device cooperate to ensure that signals provided to said feedback port are inverted with respect to said input delay signal.

12. An apparatus for generating pulses as recited in claim 11 wherein said logic gate is one of an AND gate and a NAND gate.

13. An apparatus for generating pulses as recited in claim 12 wherein said latch device is a differential latch.

14. An apparatus for generating pulses as recited in claim 12 wherein said first state and said second state each has a respective state interval and wherein a process of pulse generation is initiated in response to said delay unit input signal changing from one of said first state and said second state to the other of said first state and said second state; said respective interval of said other state being greater than twice said delay interval.

15. An apparatus for generating pulses as recited in claim 11 wherein said latch device is a differential latch.

16. An apparatus for generating pulses as recited in claim 15 wherein said first state and said second state each has a respective state interval and wherein a process of pulse generation is initiated in response to said delay unit input signal changing from one of said first state and said second state to the other of said first state and said second state; said respective interval of said other state being greater than twice said delay interval.

17. An apparatus for generating pulses as recited in claim 11 wherein said first state and said second state each has a respective state interval and wherein a process of pulse generation is initiated in response to said delay unit input signal changing from one of said first state and said second state to the other of said first state and said second state; said respective interval of said other state being greater than twice said delay interval.

* * * * *